United States Patent
Anderson et al.

(10) Patent No.: US 6,728,370 B1
(45) Date of Patent: Apr. 27, 2004

(54) METHOD AND APPARATUS FOR IMPEDANCE MATCHING

(75) Inventors: Jeffrey J. Anderson, Austin, TX (US); Walter S. Schopfer, Austin, TX (US); Carlin D. Cabler, Austin, TX (US)

(73) Assignee: Legerity, Inc., Austin, TX (US)

( * ) Notice: Subject to any disclaimer, the term of this patent is extended or adjusted under 35 U.S.C. 154(b) by 0 days.

(21) Appl. No.: 09/268,011

(22) Filed: Mar. 15, 1999

(51) Int. Cl.[7] ............................................. H04M 1/00
(52) U.S. Cl. ............................................. 379/398; 379/394
(58) Field of Search ................................ 379/394, 398, 379/399.01, 400, 30

(56) References Cited

U.S. PATENT DOCUMENTS 4,604,741 A * 8/1986 Barsellotti ................. 379/400
5,258,713 A * 11/1993 Rosch et al. ................ 379/398
6,192,109 B1 * 2/2001 Amrany et al. .............. 379/30

* cited by examiner

*Primary Examiner*—Xu Mei
*Assistant Examiner*—Jefferey Harold
(74) *Attorney, Agent, or Firm*—Williams, Morgan & Amerson, P.C.

(57) ABSTRACT

A method and apparatus is provided for impedance matching for a system capable of supporting voice and data bands. The method includes receiving an input signal having a voice and data band, filtering at least a portion of the data band of the input signal to provide a filtered signal, and adjusting the impedance of the system for the voice band in response to the filtered signal to provide an output signal.

22 Claims, 5 Drawing Sheets

METHOD AND APPARATUS FOR IMPEDANCE MATCHING

BACKGROUND OF THE INVENTION

1. Field of the Invention

This invention relates generally to telecommunications, and, more particularly, to impedance matching in a system supporting Plain Old Telephone System (POTS) and x-digital subscriber line (xDSL) techniques.

2. Description of the Related Art

In communications systems, particularly telephony, it is common practice to transmit signals between a subscriber station and a central switching office via a two-wire bi-directional communication channel. A line card generally connects the subscriber station to the central switching office. The primary functions of the line card range from supplying talk battery to performing impedance matching to handling ringing signals, voice signals, and testing signals.

Subscriber lines generally have natural characteristic impedance. To drive a signal on a subscriber line while minimizing signal reflection from the far end of the subscriber line and maximizing the signal power coming out the far end, it is desirable to match the characteristic impedance of the subscriber line when it is terminated. This impedance is typically symbolized as $Z_{LOOP}$, which is a function of frequency and generally decreases as frequency increases. For POTS lines, the value of $Z_{LOOP}$ is determined by individual telephone authorities in various countries and, although somewhat variable, is in the range of 600–900 ohms and may or may not include some type of capacitive element. The extent to which a signal driver is matched to the subscriber line in these systems is measured with a parameter known as 'Return-Loss'. Perfect matching will have an infinite return loss. This indicates that none of the signal transmitted down the wire is reflected back to the driver.

In a Plain Old Telephone System (POTS), the impedance matching function has generally been performed by line cards using a variety of well-known impedance matching filter loops. The function of the impedance matching filter loop in POTS-only applications is to take the input signal, modify it through a programmable gain and delay element, and feed it back to the output so that the input signal sees a different response than it would without the presence of the impedance matching filter. The above-described impedance matching process is effective in accomplishing the intended purpose, at least as it pertains to a POTS-only system.

The Plain Old Telephone System, designed primarily for voice communication, provides an inadequate data transmission rate for many modern applications. To meet the demand for high-speed communication, designers have sought innovative and cost-effective solutions that would take advantage of the existing network infrastructure. Several technological solutions proposed in the telecommunications industry use the existing network of telephone wires. A promising one of these technologies is the xDSL technology.

xDSL is making the existing network of telephone lines more robust and versatile. Once considered virtually unusable for broadband communications, an ordinary twisted pair equipped with DSL interfaces can transmit video, television, and very high-speed data. The fact that more than six hundred million telephone lines exist around the world is a compelling reason for these lines to be used as the primary transmission conduits for at least several more decades. Because DSL utilizes telephone wiring already installed in virtually every home and business in the world, it has been embraced by many as one of the more promising and viable options.

There are now at least three popular versions of DSL technology, namely Asymmetrical Digital Subscriber Line (ADSL), Very High-Speed Digital Subscriber Line (VDSL), and Symmetric Digital Subscriber Line (SDSL). Although each technology is generally directed at different types of users, they all share certain characteristics. For example, all four DSL systems utilize the existing, ubiquitous telephone wiring infrastructure, deliver greater bandwidth, and operate by employing special digital signal processing. Because the aforementioned technologies are well known in the art, they will not be described in detail herein.

DSL and Plain Old Telephone System technologies can co-exist in one line (e.g., also referred to as a "subscriber line"). Traditional analog voice band interfaces use the same frequency band, 0–4 Kilohertz (KHz), as telephone service, thereby preventing concurrent voice and data use. A DSL interface, on the other hand, operates at frequencies above the voice channels, from 25 KHz to 1.1 Megahertz (MHz). Standards for certain derivatives of DSL are still in definition, and, therefore, are subject to change. Thus, a single DSL line is capable of offering simultaneous channels for voice and data. It should be noted that the standards for certain derivatives of ADSL are still in definition as of this writing, and therefore are subject to change.

DSL systems use digital signal processing (DSP) to increase throughput and signal quality through common copper telephone wire. It provides a downstream data transfer rate from the DSL Point-of-Presence (POP) to the subscriber location at speeds of up to 1.5 megabits per second (MBPS). The transfer rate of 1.5 MBPS, for instance, is fifty times faster than a conventional 28.8 kilobits per second (KBPS).

Although DSL and POTS systems can co-exist on one line, the DSL traffic passing through the POTS circuitry impairs the functionality of the impedance matching filter of the POTS circuitry. This is because decimators and analog-to-digital converters that are ordinarily utilized in a POTS-only system cannot process the high frequencies of the data band, thus causing the performance of the POTS impedance matching filter to degrade.

The present invention is directed to overcoming, or at least reducing the effects of, one or more of the problems set forth above.

SUMMARY OF THE INVENTION

In one aspect of the present invention, a method is provided for impedance matching. The method includes receiving an input signal having a voice and data band, filtering at least a portion of the data band of the input signal to provide a filtered signal, and adjusting the impedance of the system for the voice band in response to the filtered signal to provide an output signal.

In another aspect of the present invention, an apparatus is provided for impedance matching for a system supporting voice and data bands. The apparatus includes a driver having an input terminal and an output terminal, the output terminal of the driver is capable of providing an input signal; a data filter having an input terminal adapted to receive the input signal, the data filter capable of filtering at least a portion of the frequencies from the data band of the input signal to provide a filtered signal; and an impedance matching module capable of adjusting the impedance of the system in response to the filtered signal and capable of providing a first output signal to the input terminal of the driver.

BRIEF DESCRIPTION OF THE DRAWINGS

The invention may be understood by reference to the following description taken in conjunction with the accompanying drawings, in which like reference numerals identify like elements, and in which.

Figure 1:
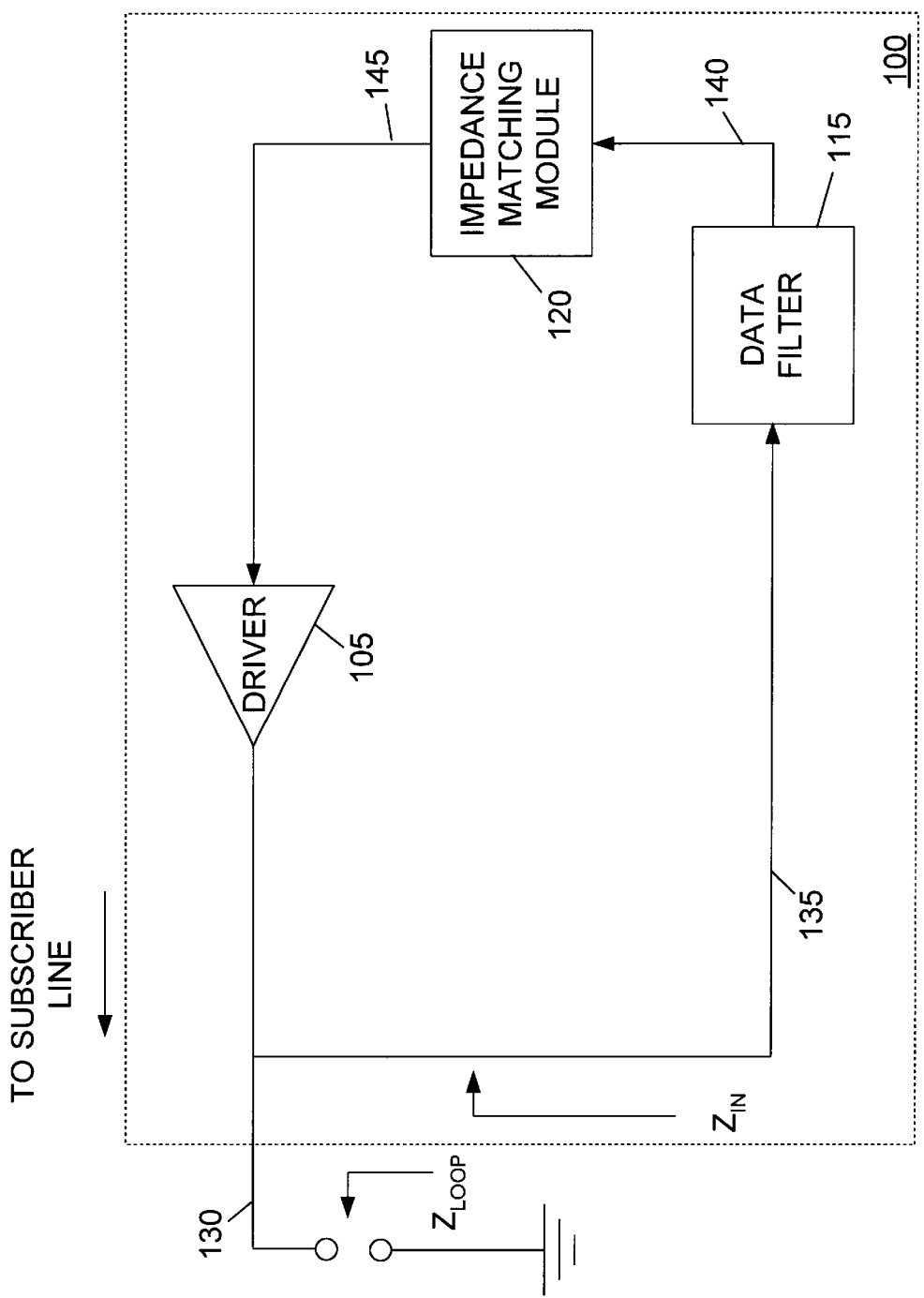
FIG. 1 illustrates a first embodiment of an apparatus in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring now to the drawings, and in particular to FIG. 1, an apparatus 100 in accordance with the present invention is illustrated. For clarity and ease of illustration, FIG. 1 depicts a single-ended model of the apparatus 100.

The apparatus 100 of FIG. 1 is capable of sending and receiving a signal comprising voice and data band. The voice band, as used herein, refers to a POTS voice signal ranging from 0–4 KHz. The data band refers to frequencies above the voice band, and may include, for example, the frequency range employed in xDSL technologies.

FIG. 1 includes a driver 105, a data filter 115, and an impedance matching module 120. An output terminal of the driver 105 is coupled to one terminal of a subscriber line 130, which may be a Public Switched Telephone Network (PSTN) line, a Private Branch Exchange (PBX) line, or any other medium capable of transmitting signals.

The impedance of the subscriber line 130 is herein denoted as $Z_{LOOP}$, and impedance seen by an incoming signal from the subscriber line 130 is hereinafter referred to as $Z_{IN}$. The value of $Z_{LOOP}$, which is determined by individual telephone authorities in various countries, may be in the range of 600–900 ohms for the POTS band and in the range of 100–135 ohms for the xDSL band.

Figure 2:
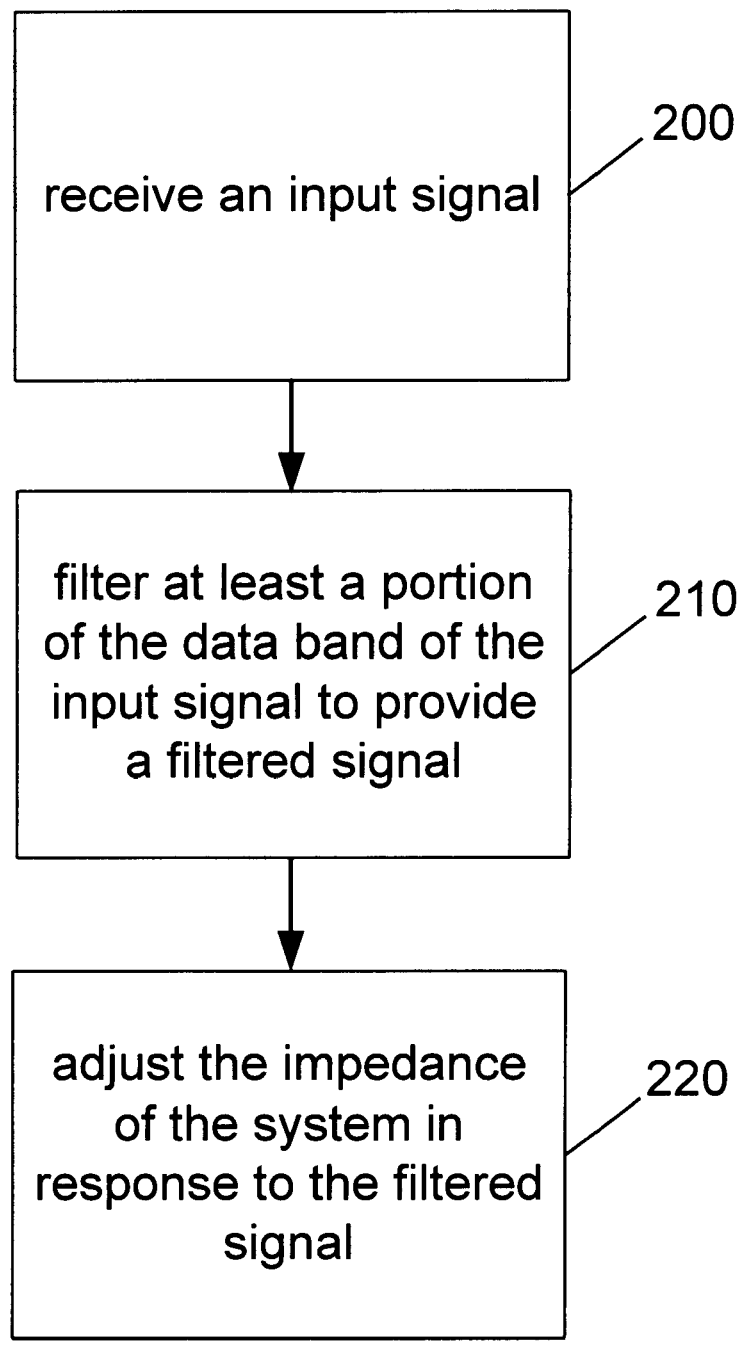
FIG. 2 depicts an embodiment of a method in accordance with the present invention that can be implemented by the apparatus of FIG. 1.

FIG. 2 illustrates a method in accordance with the present invention that can be implemented by the apparatus 100 of FIG. 1 to adjust $Z_{IN}$, the impedance seen by an incoming signal from the subscriber line 130. At block 200, the data filter 115 receives an input signal from a line 135. Because voice and/or data can be transmitted on the subscriber line 130, the input signal received by the data filter 115 may include voice and data band frequencies. To prevent higher frequencies of the data band from impairing the function of the impedance matching module 120, the data filter 115, at block 210, filters at least a portion, if not all, of the frequencies above 4 KHz and provides a filtered (i.e., voice only) signal to the impedance module 120 on a line 140. The impedance module 120, at block 220, adjusts $Z_{IN}$ to substantially match the impedance of the subscriber line 130 for the POTS band in response to receiving the filtered signal from the line 140.

Figure 3:
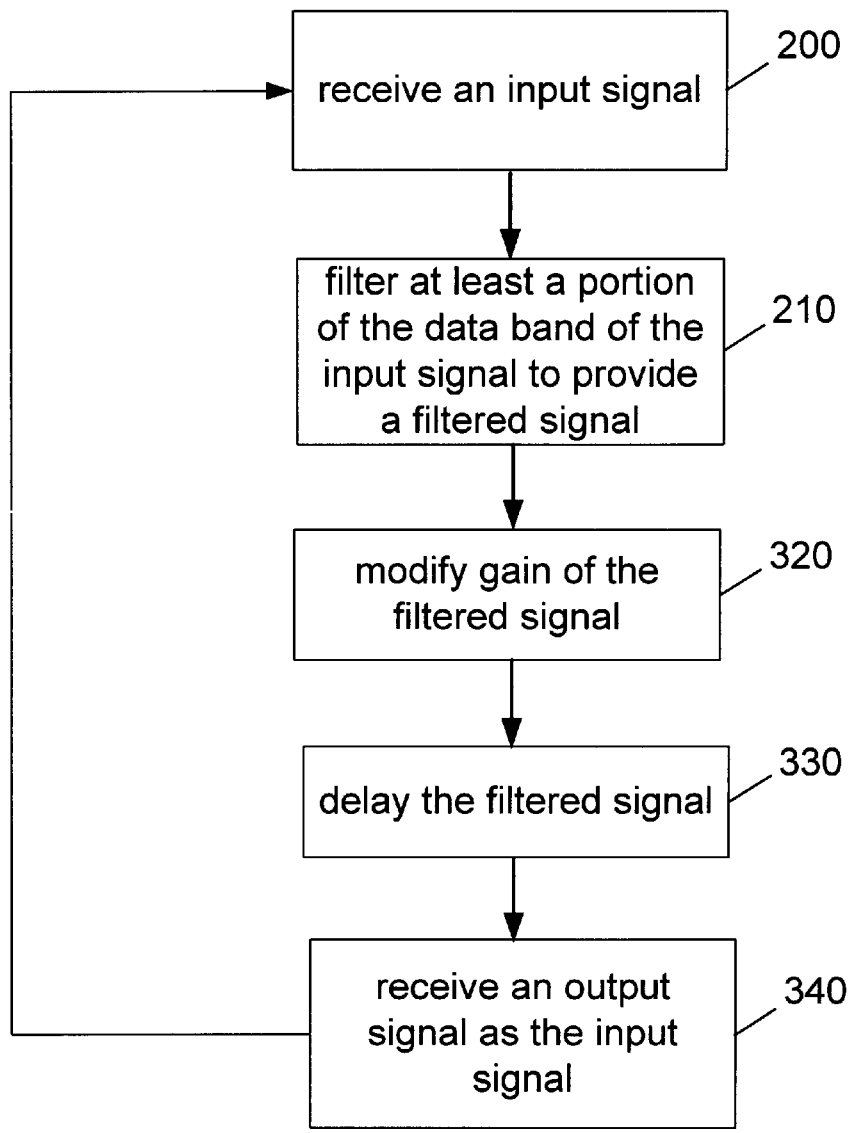
FIG. 3 illustrates an alternative embodiment of a method in accordance with the present invention that can be implemented by the apparatus of FIG. 1.

FIG. 3 illustrates another embodiment of a method that can be employed by the apparatus 100 of FIG. 1 to adjust $Z_{IN}$ to substantially match the impedance of the subscriber line 130. As denoted by like numbers, blocks 200 and 210 are the same as those of FIG. 2. At block 320, the impedance module 120 adjusts the gain of the filtered signal from the line 140 by a selected amount. The impedance module 120 may, for example, have a gain ranging from one to negative one, although the selected gain may vary in other implementations. The impedance module 120 may also, at block 330, delay the filtered signal from the line 140 by a selected interval to adjust $Z_{IN}$ to substantially equal $Z_{LOOP}$. Those skilled in the art will appreciate that the interval by which the filtered signal is delayed may be implementation specific. At block 340, an output signal from the impedance module 120 on a line 145 is received as at least a portion of the input signal on the line 135 via the driver 105.

Figure 4:
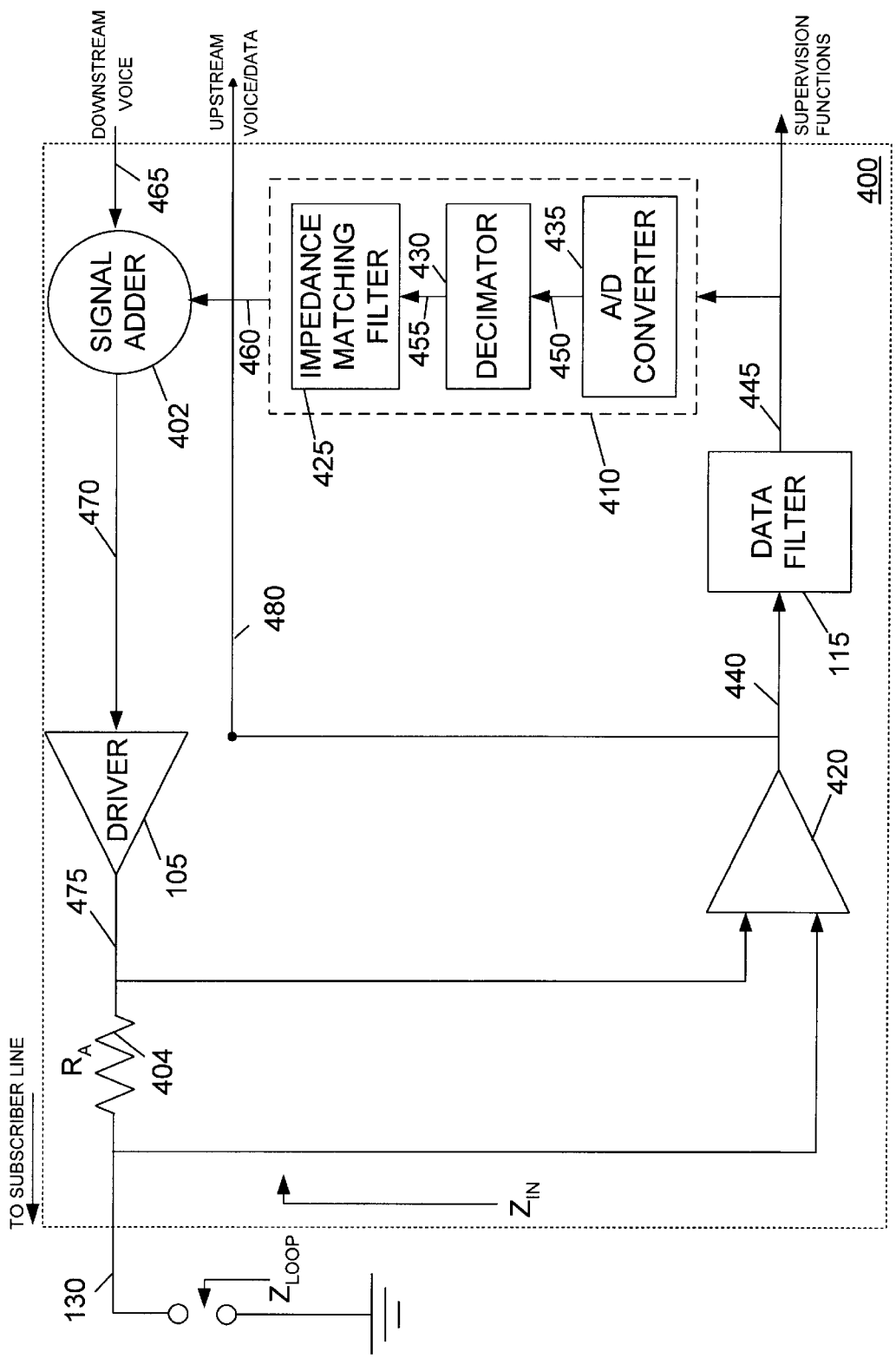
FIG. 4 depicts one embodiment of a more detailed block diagram of the apparatus of FIG. 1 that can be utilized to implement the methods of FIGS. 2 and 3.

FIG. 4 illustrates one embodiment of a more detailed block diagram of the apparatus 100 of FIG. 1 and, accordingly, the illustrated embodiment can also implement the methods of FIGS. 2 and 3. An apparatus 400 of FIG. 4 includes the data filter 115 and driver 105, which are identical to the ones shown in FIG. 1, as indicated by like numbering. FIG. 4 further includes a signal adder 402, a resistor ($R_A$) 404, an impedance matching module 410 and a sense amplifier 420. The impedance matching module 410 includes an impedance matching filter 425, a decimator 430, and an analog-to-digital (A/D) converter 435.

The methods of FIGS. 2 and 3 can be implemented by the apparatus 400 of FIG. 4 to adjust $Z_{IN}$ (impedance seen by an incoming signal from the subscriber line) to substantially match $Z_{LOOP}$ (the impedance of the subscriber line 130) for the voice as well as the data band. The sense amplifier 420 measures a voltage across the resistor 404 and, at block 200 (see FIGS. 2 and 3), provides an input signal on a line 440 that is proportional to the current flowing through the resistor 404. The data filter 115, at block 210, filters at least a portion, if not all, of the frequencies above 4 KHz and provides a filtered (i.e., voice only) signal to the impedance module 410 on a line 445. The A/D converter 435 converts the filtered signal on the line 445 to a digital signal and provides it to the decimator 430 on a line 450.

The decimator 430, through the process of decimation, reduces the frequency of the bits of the signal on the line 450 and provides a larger, and more accurate, signal on a line 455 to the impedance matching filter 425. Decimation is a process well known to those skilled in the relevant art and, therefore, it will not be described in detail herein. Those skilled in the art will appreciate that decimation can be utilized to filter and eliminate undesirable high-frequency components from the signal on the line 450 before it is provided to the impedance matching filter 425 on the line 455.

The impedance matching filter 425, at blocks 320 and 330, is capable of modifying the gain of the signal on the line 455 by a selected amount, as well as capable of delaying the signal by a selected interval to adjust $Z_{IN}$ to substantially equal $Z_{LOOP}$ for the POTS (i.e., voice) band. At block 340, an output signal from the impedance matching filter 425 on a line 460 is provided to the driver 105 on a line 470. In one embodiment, the output signal from the impedance matching filter 425 is added to a downstream signal on a line 465 and then provided to the driver 105 on the line 470. The driver 105 drives the signal from the line 470 onto a line 475. The sense amplifier 420 measures the voltage across the resistor 404 and provides the input signal on the line 440 to the data filter 115.

The data impedance (e.g., as opposed to POTS/voice impedance) seen by an incoming signal is substantially equal to the value of the resistor 404. This is because the apparatus 100 of FIG. 1, through the use of the data filter 115, isolates the impedance matching module 120 for the higher frequencies of the data band. When the data band is substantially isolated from the impedance matching module 120, the natural impedance of the apparatus 100 is substantially equals to the impedance of the data band. The data impedance is therefore set primarily by the resistor 404. Thus, as an example, a 100-ohm resistor can be utilized to achieve a data impedance of substantially 100 ohms.

As shown in FIG. 4, an incoming voice and data signal can be accessed from a line 480 for additional processing, such as separation of the voice and data bands, for example. As an alternative, the voice signal may also be accessed from the line 445. Additionally, the signal from the line 445 can be accessed for the purposes of performing supervision functions that may be typically required for maintenance of the subscriber line 130.

Figure 5:
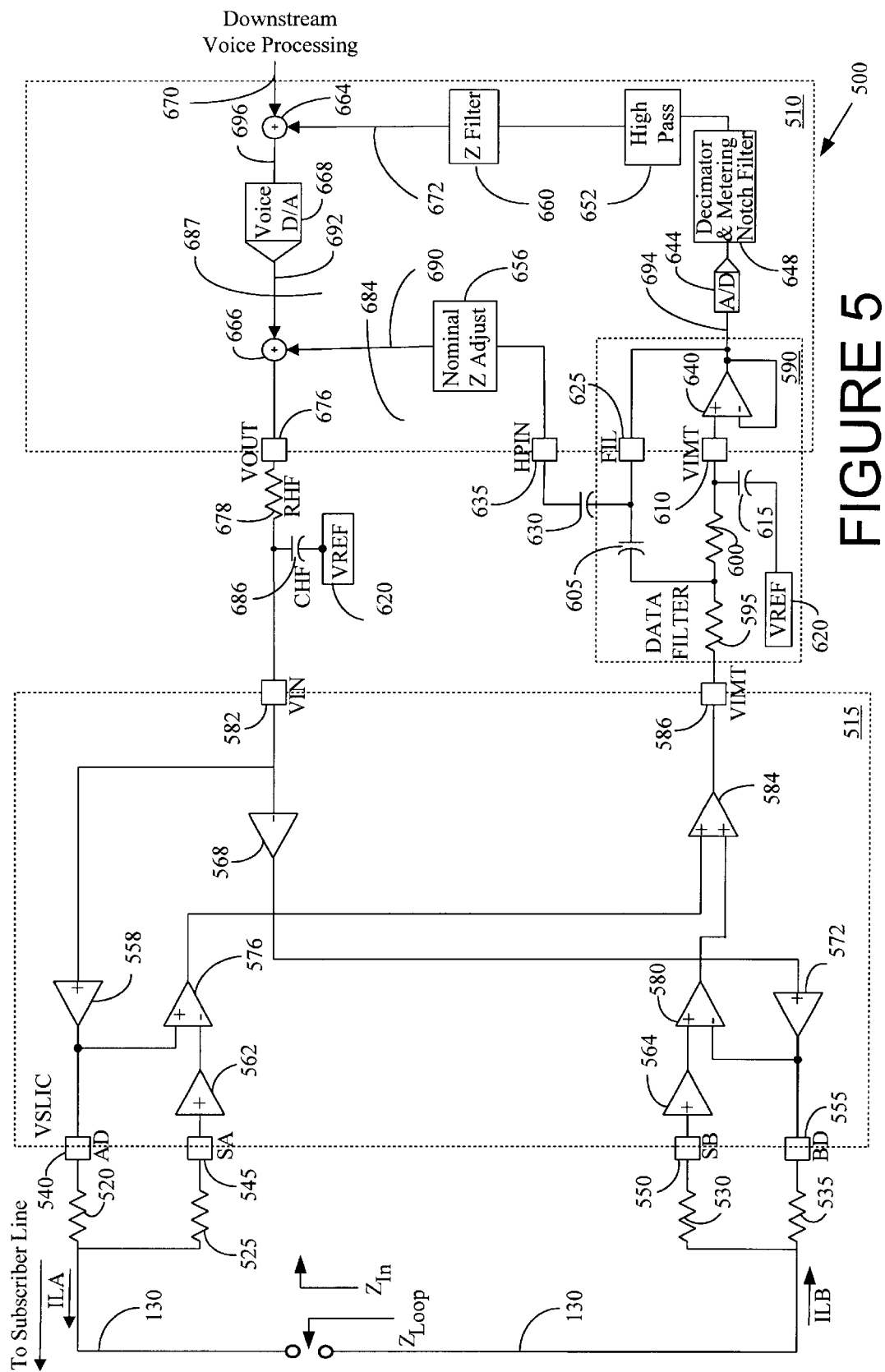
FIG. 5 depicts another embodiment of an apparatus in accordance with the present invention that can implement the methods of FIGS. 2 and 3.

FIG. 5 illustrates an alternative embodiment of an apparatus 500 in accordance with the present invention. FIG. 5 depicts a signal processing block 510 and a voltage subscriber line integrated circuit (VSLIC) 515 coupled to the subscriber line 130 via first, second, third, and fourth resistors 520, 525, 530, 535. Although the illustrated embodiment includes the VSLIC 515, those skilled in the art will appreciate that other subscriber line integrated circuits (SLICs), including current feed SLICs, may also be utilized in alternative embodiments. A first terminal of the first and second resistors 520, 525 is coupled to a first terminal of the subscriber line 130, while a second terminal of the first and second resistors 520, 525 is coupled to pins AD and SA 540, 545 of the VSLIC 515, respectively. A first terminal of the third and fourth resistors 530, 535 is coupled to a second terminal of the subscriber line 130, and a second terminal of the third and fourth resistors 530, 535 is coupled to pins SB and BD 550, 555, respectively.

For clarity, only relevant portions of the VSLIC 515 and the signal processing block 510 are illustrated. The VSLIC 515 includes first, second, third, fourth, and fifth buffers 558, 562, 564, 568, 572, as well as first and second differential amplifiers 576, 580. An input terminal of the first buffer 558 is coupled to a VIN pin 582, and an output terminal of the first buffer 558 is coupled to the AD pin 540 and to a non-inverting input terminal of the first differential amplifier 576. An input terminal of the second buffer 562 is coupled to the SA pin 545 and an output terminal of the second buffer 562 is coupled to an inverting input terminal of the first differential amplifier 576. An input terminal of the third buffer 564 is coupled to the SB pin 550, and an output terminal of the third buffer 564 is coupled to a non-inverting input terminal of the second differential amplifier 580. An input terminal of the fourth buffer 568 is coupled to the VIN pin 582, and an output terminal of the fourth buffer 568 is coupled to an input terminal of the fifth buffer 572. The signals at the AD and BD pins 540, 555 represent a differential version of the signal at the $V_{IN}$ pin 582. An output terminal of the fifth buffer 572 is coupled to the BD pin 555, as well as to an inverting input terminal of the second differential amplifier 580. An output terminal of the first differential amplifier 576 is coupled to a first input terminal of an amplifier 584, and an output terminal of the second differential amplifier 580 is coupled to a second input terminal of the amplifier 584. An output of the amplifier 584 is coupled to a VIMT pin 586 of the VSLIC 515.

The VIMT pin 586 of the VSLIC 515 is coupled to a data filter 590 that substantially filters the frequencies of the data band and provides a voice-only signal to the signal processing block 510. The data filter 590 includes first and second resistors 595, 600. A first terminal of the first resistor 595 is coupled to the VIMT pin 586 and the second terminal of the first resistor 595 is coupled to a first terminal of the second resistor 600. The first terminal of the second resistor 600 is coupled to a first terminal of a first capacitor 605 and a second terminal of the second resistor 600 is coupled to a VIMT pin 610 of the signal processing block 510, as well as to a first terminal of a second capacitor 615. A second terminal of the second capacitor 615 is coupled to a reference voltage, $V_{REF}$ 620. A second terminal of the first capacitor 605 is coupled to a FIL pin 625 as well as to a first terminal of a third capacitor 630. A second terminal of the third capacitor 630 is coupled to an HPIN pin 635 of the signal processing block 510.

The signal processing block 510 includes a differential amplifier 640, an analog-to-digital (A/D) converter 644, a decimator 648, a high-pass filter 652, a first and second impedance matching filter 656, 660, a first and second signal adder 664, 666, and a digital-to-analog (D/A) converter 668. A non-inverting input terminal of the differential amplifier 640 is coupled the VIMT pin 610 of the signal processing block 510, while an inverting input terminal is coupled to an output terminal of the differential amplifier 640. The output terminal of the differential amplifier 640 is coupled to the FIL pin 625 and an input terminal of the A/D converter 644. An output terminal of the A/D converter 644 is coupled to an input terminal of the decimator 648, and an output terminal of the decimator 648 is coupled to an input terminal of the high-pass filter 652. The output terminal of the high-pass filter 652 is coupled to an input terminal of the second impedance matching filter 660, while an output terminal of the second impedance matching filter 660 is coupled to a first input terminal of the first signal adder 664 via a line 672. A second input terminal of the first signal adder 664 receives a downstream voice signal on a line 670. The first signal adder 664 adds signals from the lines 672, 670 and provides the resulting signal to an input terminal of the D/A converter 668. An output terminal of the D/A converter 668 is coupled to a first input terminal of the second signal adder 666. An input terminal of the first impedance matching filter 656 is coupled to the HPIN pin 635, and its output terminal is coupled to a second input terminal of the second signal adder 666. An output of the second signal adder 666 is coupled to a $V_{OUT}$ pin 676 of the signal processing block 510.

The $V_{OUT}$ pin 676 is coupled to the $V_{IN}$ pin 582 of the VSLIC 515 via a resistor, RHF 678. Specifically, a first terminal of the RHF resistor 678 is coupled to the $V_{OUT}$ pin 676, and a second terminal of the resistor 678 is coupled to a first terminal of a capacitor 686, as well as to the $V_{IN}$ pin 582. A second terminal of the capacitor 686 is coupled to the reference voltage $V_{REF}$ 620.

The illustrated embodiment of FIG. 5 employs two impedance matching filter loops 688, 687. The first loop 688 includes the first impedance matching filter 656, while the second loop 687 includes the second impedance matching filter 660. The first impedance matching filter 656 of the first loop 688 is capable of providing a selected amount of "fixed" gain and delay, whereas the second impedance matching filter 660 of the second loop 687 is capable of providing a "programmable" amount of gain and delay. Those skilled in the art will appreciate that any combination of "fixed" or "programmable" impedance matching filters 656, 660 may be employed in a particular embodiment, depending on the specific implementation.

The apparatus 500 of FIG. 5 can implement the methods of FIGS. 2 and 3 to adjust $Z_{IN}$ (impedance seen by an incoming signal from the subscriber line) to substantially match $Z_{LOOP}$ (the impedance of the subscriber line) for the voice as well as the data band. The amplifier 584 of the VSLIC 515, at block 200 (see FIGS. 2 and 3), provides an input signal from the subscriber line 130 to the VIMT pin 586 that is proportional to the sum of the current flowing through the first and fourth resistors 520, 535. The data filter 590, at block 210, filters at least a portion, if not all, of the frequencies above 4 KHz from the signal at the VIMT pin 586 of the VSLIC 515 and provides a filtered (i.e., voice signal with a DC component) signal to the input terminals of the A/D converter 644 and to the first terminal of the third capacitor 630. The third capacitor 630 substantially removes the DC component from the filtered signal and provides a substantially AC voice signal to the HPIN 635.

The first impedance matching filter 656, at blocks 320 and 330, is capable of modifying the gain of the signal from the HPIN pin 635 of the signal processing block 510 by a selected amount, as well as capable of delaying the signal by a selected interval to adjust $Z_{IN}$ to substantially equal $Z_{LOOP}$. An output signal of the first impedance matching filter 656 on the line 690 can be added, at block 340 (see FIG. 3), to a signal on the line 692 and then provided to the VIN pin 582. The signal from the VIN pin 582 is eventually provided to the VIMT pin 586 of the VSLIC 515, and then to the input terminal of the data filter 590.

The A/D converter 644 converts the filtered signal on a line 694 to a digital signal and provides it to the input terminal of the decimator 648. The decimator 648, through the process of decimation, reduces the frequency of the bits of the signal and provides a larger, and more accurate, signal to the input terminal of the high-pass filter 652. The high-pass filter 652 removes substantially all of the DC component from the received signal and provides an AC-voice-only-signal to the input terminal of the second impedance matching filter 660.

The second impedance matching filter 660, at blocks 320 and 330, is capable of modifying the gain of the signal from the high pass filter 652 by a selected amount, as well as capable of delaying the signal by a selected interval to adjust $Z_{IN}$ to substantially equal $Z_{LOOP}$. The second impedance matching filter 660 can be a programmable impedance matching filter that allows a user to program the gain factor, the delay factor, or a combination thereof to vary $Z_{IN}$. An output of the second impedance matching filter 660 can be added to a downstream signal on the line 670 and then provided to the input terminal of the D/A converter 668. The D/A converter 668 converts the signal on the line 696 to an analog signal and provides it to the first input of the signal adder 666.

The data impedance (e.g., as opposed to the POTS impedance) seen by an incoming signal is substantially equal to the sum of the values of the resistors 520, 535. This is because the apparatus 500 of FIG. 5, through the use of the data filter 590, isolates the first and second impedance matching filters 656, 660 for the higher frequencies of the data band. The data impedance is therefore set primarily by the resistors 520, 535. Thus, as an example, if the resistors 520, 535 were 50-ohm resistors, the data impedance would be substantially 100 ohms. Those skilled in the art will appreciate that the value of the resistors 520, 535 may be implementation specific, depending on the desired data impedance. Although the illustrated embodiment utilizes resistors 520, 535, it is envisioned that other "resistive" devices, such as transistors or the like, may also be employed to achieve the desired purpose.

The apparatuses 100, 400, 500 (see FIGS. 1, 4, and 5, respectively) can be integrated in a system capable of transmitting and receiving signals having a voice band and a data band. For example, the apparatuses 100, 400, 500 may be implemented in a line card that supports both POTS and ADSL technologies.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of impedance matching in a system supporting at least a voice and data band, comprising:

receiving an input signal having the voice and data band;

filtering, at least a portion of the data band of the input signal to provide a filtered signal; and adjusting the impedance of the system for the voice band in response to the filtered signal to provide an output signal, wherein the adjusting includes modifying a gain of the filtered signal by a selected factor and delaying the filtered signal by a selected interval, and adjusting a gain of the filtered signal by a second selected factor to provide a second output signal, wherein the second output signal is added to the output signal.

2. The method of claim 1, further including matching an impedance of the data band of the input signal to a natural impedance response of the system, and wherein adjusting the impedance comprises adjusting the impedance seen by at least a portion of the received input signal.

3. The method of claim 1, wherein receiving includes receiving the output signal as a portion of the input signal.

4. The method of claim 1, wherein receiving includes receiving a sum of a downstream voice signal and the output signal as a portion of the input signal.

5. The method of claim 1, wherein receiving includes measuring a voltage across a resistor and providing a current proportional to the measured voltage as the input signal.

6. The method of claim 1, wherein receiving the input signal comprises receiving a voltage signal proportional to a loop current.

7. The system of claim 6, wherein the subscriber line integrated circuit is a voltage subscriber line integrated circuit having a first and second terminal.

8. The method of claim 1, wherein receiving, the input signal comprises receiving a current signal proportional to a loop current.

9. An apparatus for impedance matching for a system supporting voice and data bands, comprising:
   a driver having an input terminal and output terminal, the output terminal of the driver capable of providing an input signal;
   a data filter having an input terminal adapted to receive the input signal, the data filter capable of filtering at least a portion of the frequencies from the data band of the input signal to provide a filtered signal;
   an impedance matching module capable of adjusting the impedance of the system in response to the filtered signal and capable of providing a first output signal to the input terminal of the driver; and
   a first signal adder having an input terminal and an output terminal, the input terminal of the first signal adder coupled to the output terminal of the impedance matching module and the output terminal of the first signal adder coupled to an input terminal of the driver.

10. The apparatus of claim 9, further including a resistor having a first and second terminal, the first terminal of the resistor coupled to a subscriber line and the second terminal coupled to the output terminal of the driver.

11. The apparatus of claim 10, further including a sense amplifier having a first and second input terminal and an output terminal, wherein the first and second input terminals of the sense amplifier are coupled to the respective first and second terminals of the resistor and wherein the output terminal of the sense amplifier is coupled to the input terminal of the data filter.

12. The apparatus of claim 11, wherein the impedance matching module comprises:
   an analog-to-digital converter capable of converting the filtered signal to a digital filtered signal;
   a decimator having an input terminal capable of receiving the digital filtered signal and an output terminal capable of providing a decimated signal; and
   a first impedance matching filter having an input terminal capable of receiving the decimated signal and an output terminal capable of providing the first output signal.

13. The apparatus of claim 12, wherein the first impedance matching filter is a programmable impedance matching filter.

14. The apparatus of claim 12, further comprising:
   a second impedance matching filter having an input and an output terminal, the input terminal of the second impedance matching filter capable of receiving the filtered signal from the data filter and the output terminal capable of providing a second output signal; and
   a second signal adder having a first and second input terminal and an output terminal, the first input terminal coupled to the output terminal of the first signal adder, the second input terminal coupled to the input terminal of the second impedance matching filter, and the output terminal of the signal adder coupled to the input terminal of the driver.

15. The apparatus of claim 9, wherein the impedance matching module is adapted to at least one of adjust a gain of the filtered signal and delay the filtered signal by a selected interval.

16. The apparatus of claim 9, wherein the impedance matching module is capable of adjusting the impedance seen by at least a portion of the input signal received from a subscriber line.

17. A system supporting transmission of signals carrying voice and data on a subscriber line, comprising:
   a subscriber line integrated circuit adapted to interface with the subscriber line and capable of providing an input signal from the subscriber line,
   a data filter having an input terminal adapted to receive the input signal, the data filter capable of filtering at least a portion of the frequencies from a data band of the input signal to provide a filtered signal; and
   a processor capable of adjusting the impedance of the system based on adjusting a gain of the filtered signal and delaying the filtered signal by a selected time, wherein the processor further comprises:
   a first impedance matching loop including:
      a first impedance matching filter having an input terminal and an output terminal, the input terminal adapted to receive the filtered signal; and
      a first signal adder having a first input terminal and a second input terminal, the first input terminal coupled to the output terminal of the first impedance matching filter; and
   a second impedance matching loop including:
      a second impedance matching filter having an input terminal and an output terminal, the input terminal adapted to receive the filtered signal; and
      a second signal adder having a first input terminal and a second input terminal, the first input terminal of the second signal adder coupled to the output terminal of the second impedance matching filter and the second input terminal of the signal adder coupled to the second input terminal of the first signal adder.

18. The system of claim 17, wherein the second impedance matching loop further comprises:
   an analog-to-digital converter having an output terminal;
   a decimator having an input terminal and an output terminal, the input terminal coupled to the output terminal of the analog-to-digital converter; and
   a high-pass filter having an input and output terminal, the input terminal coupled to the output of the decimator and the output terminal coupled to the input of the second impedance matching filter.

19. The system of claim 17, wherein the second impedance matching loop further includes a digital-to-analog converter having an input and an output terminal, the input terminal coupled to the output terminal of the second signal adder and the output terminal of the signal adder coupled to the output terminal of the first signal adder.

20. The system of claim 17, further comprising:
   a first resistor having a first and second terminal, the first terminal coupled to a first terminal of the subscriber line and the second terminal coupled to the first terminal of the voltage subscriber line interface circuit; and
   a second resistor having a first and second terminal, the first terminal coupled to a second terminal of the subscriber line and the second terminal coupled to the second terminal of the voltage subscriber line interface circuit.

21. The system of claim 17, wherein the signal processing block is capable of adjusting the impedance seen by at least a portion of the input signal received from a subscriber line.

22. A system supporting transmission of signals carrying voice and data on a subscriber line, comprising:

means for receiving an input signal having a voice and data band;

means for filtering at least a portion of the data band of the input signal to provide a filtered signal; and means for adjusting the impedance of the system in response to the filtered signal and in response to adjusting a gain level of the filtered signal and delaying the filtered signal by a selected interval, wherein adjusting a gain of the filtered signal by a second selected factor to provide a second output signal wherein the second output signal is added to the output signal.

* * * * *

UNITED STATES PATENT AND TRADEMARK OFFICE
CERTIFICATE OF CORRECTION

| | | |
|---|---|---|
| PATENT NO. | : 6,728,370 B1 | Page 1 of 1 |
| APPLICATION NO. | : 09/268011 | |
| DATED | : April 27, 2004 | |
| INVENTOR(S) | : Jeffrey Jay Anderson, Walter S. Schopfer and Carlin Dru Cabler | |

It is certified that error appears in the above-identified patent and that said Letters Patent is hereby corrected as shown below:

In claim 7, column 9, line 7, replace "6" with --17--.

Signed and Sealed this

Thirtieth Day of January, 2007

JON W. DUDAS
*Director of the United States Patent and Trademark Office*